United States Patent [19]

Tochihara

[11] Patent Number: 5,732,336
[45] Date of Patent: Mar. 24, 1998

[54] RECEIVER

[75] Inventor: Shunji Tochihara, Nishitama-Gun, Japan

[73] Assignee: Kokusai Electric Co., Ltd., Tokyo, Japan

[21] Appl. No.: 683,430

[22] Filed: Jul. 18, 1996

[30] Foreign Application Priority Data

Jul. 21, 1995 [JP] Japan ................. 7-207546

[51] Int. Cl.$^6$ ................. H04B 1/18; H04B 1/06
[52] U.S. Cl. ................. 455/136; 455/130; 455/182.2; 455/183.2; 455/192.2; 455/164.2; 455/254; 455/259; 455/264
[58] Field of Search ................. 455/136, 183.1, 455/183.2, 182.2, 192.2, 192.3, 130, 139, 138, 164.1, 164.2, 254, 255, 257, 260, 259, 264

[56] References Cited

U.S. PATENT DOCUMENTS 3,758,865  9/1973  McKibben ................. 455/138
5,487,090  1/1996  Ide ................. 455/343

*Primary Examiner*—Donnie L. Crosland
*Attorney, Agent, or Firm*—Wenderoth, Lind & Ponack

[57] ABSTRACT

A reception clock signal used for a data sampling unit to sample received data is generated by a reception clock generator based on a reference clock signal, which is generated by a reference clock generator based on a reference bit rate frequency. The reference bit rate frequency is produced by a reference oscillator which is controlled by a control voltage. The control voltage is generated by a phase difference-to-voltage converter depending on the phase difference, detected by the reception clock generator, between the timing of a change in the received data and the reference clock signal. If good reception sensitivity is not available due to a phase difference, then the phase difference-to-voltage converter generates a control voltage in a manner to eliminate the phase difference, and applies the generated control voltage to a variable capacitor connected to the reference oscillator for automatically adjusting the reference bit rate frequency.

10 Claims, 3 Drawing Sheets

RECEIVER

BACKGROUND OF THE INVENTION

1. Field of the Invention

The present invention relates to a receiver for decoding received data based on a reference bit rate frequency, and more particularly to a receiver having a means for automatically adjusting a reference bit rate frequency.

2. Description of the Prior Art

Receivers such as for portable telephone sets, pagers, or the like are required to adjust a reference bit rate frequency for a decoding process in order to receive data with good reception sensitivity. Specifically, such a receiver is required to adjust its own reference bit rate frequency into conformity with the reference bit rate frequency in a transmitter for quickly and reliably establishing bit synchronism with received data even in geographical areas where the electric field intensity is low.

Heretofore, it has been customary for the manufacturer of a receiver to adjust the reference bit rate frequency in the receiver by manually adjusting a trimmer capacitor, a laser trimming capacitor, or the like in the receiver when the receiver is manufactured. For example, as shown in FIG. 1 of the accompanying drawings, when a receiver 1 is manufactured on a production line, the operator connects a monitor frequency counter 5 to a crystal oscillator 2 in the receiver 1, and adjusts a trimmer capacitor 3 with a tool 6 such as a screwdriver or the like to adjust a reference bit rate frequency to be supplied to a decoder 4 in the receiver 1 while viewing the reference bit rate frequency generated by the crystal oscillator 2 on the frequency counter 5.

However, the conventional practice of adjusting the reference bit rate frequency in the receiver on the production line has required a manual adjusting process which is tedious, time-consuming, and inefficient to carry out, resulting in poor productivity and high costs. Another problem is that the trimmer capacitor tends to suffer early capacity variations due to environmental changes, aging, shocks, etc., and hence needs to be readjusted or is likely to cause a receiver failure.

Furthermore, since a receiver is fixedly adjusted to a certain reference bit rate frequency, the reference bit rate frequency once adjusted is unable to cope with changes in reception in actual fields of use, and the receiver does not always provide reception sensitivity which is of a high level.

SUMMARY OF THE INVENTION

It is therefore an object of the present invention to provide a receiver which capable of automatically adjusting a reference bit rate frequency without manual intervention.

Still another object of the present invention is to provide a receiver which can provide a high level of reception sensitivity at all times regardless of changes in reception in actual fields of use.

To achieve the above objects of the present invention, there is provided a receiver comprising a reception unit for demodulating received data, a decoding unit for decoding the received data which has been demodulated by the reception unit, and a reference oscillator for supplying a reference bit rate frequency to the decoding unit. The reference oscillator comprises a voltage-controlled oscillator for varying the reference bit rate frequency according to a control voltage applied thereto, and the decoding unit comprises a data change detector for detecting the timing of a change in the received data, a reference clock generator for generating a reference clock signal based on the reference bit rate frequency, a reception clock generator for generating a reception clock signal based on the reference clock signal and detecting the phase difference between the reference clock signal and the timing of the change in the received data, a data sampling unit for sampling the received data based on the reception clock signal, a decoder for decoding the received data which has been Sampled by the data sampling unit, and a phase difference-to-voltage converter for converting the phase difference between the reference clock signal and the timing of the change in the received data into a control voltage and applying the control voltage to the reference oscillator.

The reception clock signal used for the data sampling unit to sample received data is generated by the reception clock generator based on the reference clock signal, which is generated by the reference clock generator based on the reference bit rate frequency. The reference bit rate frequency is produced by the reference oscillator which is controlled by the control voltage. The control voltage is generated by the phase difference-to-voltage converter depending on the phase difference, detected by the reception clock generator, between the timing of the change in the received data and the reference clock signal.

If the receiver suffers poor reception sensitivity due to a phase difference between the timing of the change in the received data and the reference clock signal, then the phase difference-to-voltage converter generates a control voltage in a manner to eliminate the phase difference, and applies the generated control voltage to the reference oscillator for automatically adjusting the reference bit rate frequency. The data sampling unit can thus sample the received data reliably. The receiver can provide a high level of reception sensitivity at all times in actual fields of use.

According to the present invention, the phase difference-to-voltage converter comprises means for averaging and converting phase differences over a freely selectable period of time into the control voltage. By averaging and converting phase differences over a period of time into the control voltage, the phase difference can be corrected even when the received data suffers noise caused by fading or interference in an actual field of use, thereby, the reference bit rate frequency can be automatically adjusted based on the received data in the actual field of use while minimizing the effect which the noise has on the received data. The period of time over which the phase differences are averaged may be increased to adjust the reference bit rate frequency more accurately, and may be reduced to adjust the reference bit rate frequency more quickly.

When the quality of the received data is relatively low in geographical areas where the electric field intensity is low, if the reference bit rate frequency were adjusted based on the received data of low quality, then reference bit rate frequency might not be correctly adjusted. According to the present invention, to avoid such a drawback, the decoder comprises means for supplying a setting to the phase difference-to-voltage converter if the received data has a quality lower than a preset value, whereby the reference oscillator can be controlled according to a control voltage based on the setting supplied thereto. Therefore, although the quality of the received data is poor, the reference bit rate frequency can be adjusted with a certain level of accuracy even in geographical areas where the electric field intensity is low.

According to the present invention, furthermore, the receiver further comprises a memory for storing a setting of control voltage which has been obtained based on reception of an adjustment data when the receiver is manufactured. The decoder comprises means for supplying the setting stored in the memory to the phase difference-to-voltage converter. When required, the decoder reads the setting from the memory and uses the setting for the prescription of the control voltage. Therefore, it is possible to obtain the setting used for automatically adjusting the reference bit rate frequency quickly in a simple and efficient process of having the receiver receive the adjustment data, rather than a manual adjustment process with large-scale equipment which have heretofore been conducted on the production line.

The above and other objects, features, and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

The principles of the present invention are particularly useful when embodied in a receiver which may be used as a receive-only receiver for a pager or the like or a receiver unit in a transmitter/receiver for a portable telephone set or the like.

Figure 1:
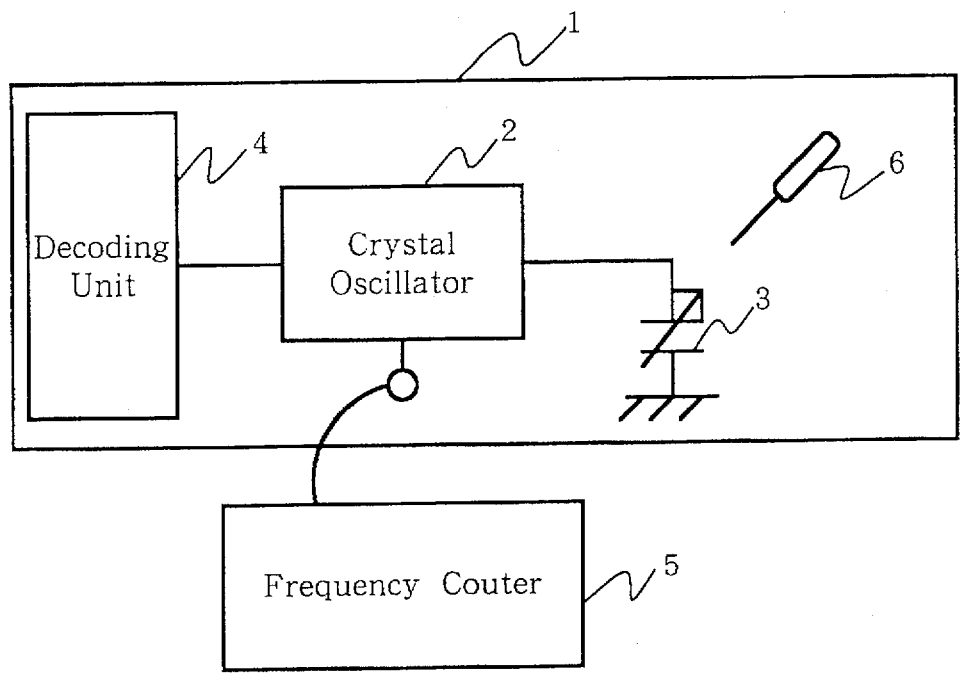
FIG. 1 is a block diagram illustrative of a conventional process of adjusting the reference bit rate frequency in a receiver.
Figure 2:
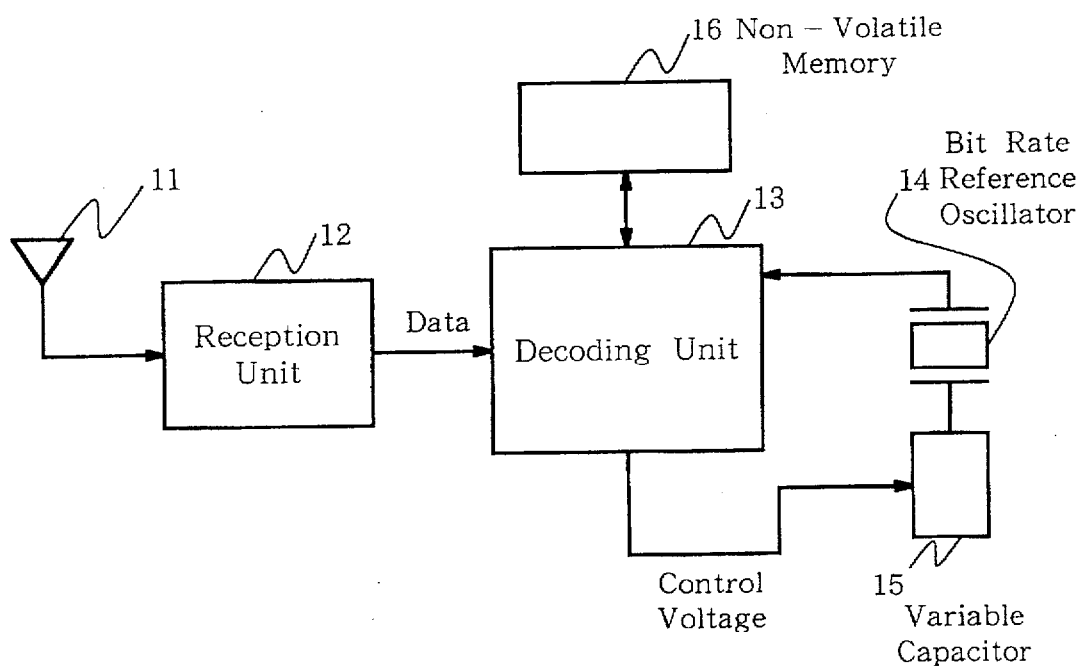
FIG. 2 is a block diagram of a receiver according to an embodiment of the present invention.

As shown in FIG. 2, a receiver according to an embodiment of the present invention comprises a reception unit 12 for demodulating received data supplied from an antenna 11, a decoding unit 13 for decoding demodulated data from the reception unit 12, a bit rate reference oscillator 14 for generating and supplying a reference bit rate frequency to the decoding unit 13, a variable capacitor 15 connected to the bit rate reference oscillator 14, and a non-volatile memory 16 for holding settings established on the production line for manufacturing the receiver.

The bit rate reference oscillator 14 with the variable capacitor 15 connected thereto serves as a voltage-controlled oscillator (VCO). When a control voltage supplied from the decoding unit 13 is applied to the variable capacitor 15 to vary the capacitance thereof, the bit rate reference oscillator 14 varies the reference bit rate frequency which it generates.

The non-volatile memory 16 comprises a read/write memory, such as an electrically erasable programmable ROM (EEPROM) or the like, which can hold its stored information without power.

Figure 3:
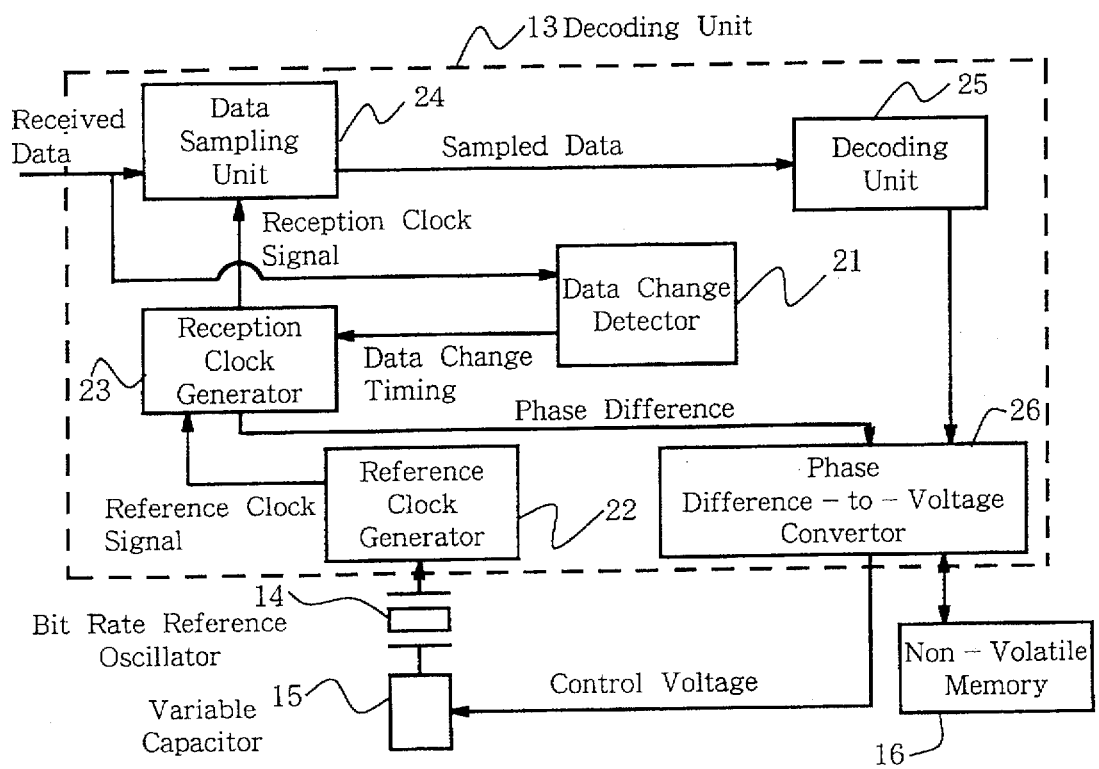
FIG. 3 is a block diagram of a decoding unit in the receiver shown in FIG. 2.

As shown in FIG. 3, the decoding unit 13 comprises a data change detector 21 for detecting the timing of a change in the received data which has been demodulated by the reception unit 12, a reference clock generator 22 for generating a reference clock signal based on the reference bit rate frequency supplied from the bit rate reference oscillator 14, a reception clock generator 23 for generating a reception clock signal based on the reference clock signal supplied from the reference clock generator 22 and detecting the phase difference between the reference clock signal and the timing of the change in the received data from the data change detector 21, a data sampling unit 24 for sampling the received data based on the reception clock signal, a decoder 25 for decoding the sampled data, and a phase difference-to-voltage converter 26 for converting the phase difference between the reference clock signal and the timing of the change in the received data into a control voltage and applying the control voltage to the variable capacitor 15 connected to the bit rate reference oscillator 14.

The decoder 25 has a function of determining whether a quality, e.g., an error rate, of the received data exceeds a preset value or not. If the quality of the received data is equal to or smaller than the preset value, then the decoder 25 reads a setting stored in the non-volatile memory 16, and controls the phase difference-to-voltage converter 26 to stop its operation to convert the phase difference into the control voltage, and supplies the setting to the phase difference-to-voltage converter 26 to enable it to generate a control voltage depending on the setting.

The decoder 25 can determine the quality of the received data using an error bit detecting/correcting code added to the received data. For example, a BCH (Bose Chaudhuri Hocquenghem) code as an ECC (error checking code) is added to data, and when the receiver receives the data, the decoder 25 detects an error bit based on the BCH code in the received data. If the received data suffers a preset number of, e.g., three, error bits or more, then the decoder 25 uses a setting stored in the non-volatile memory 16 to generate a control voltage from the phase difference-to-voltage converter 26.

In operation, the reference clock generator 22 generates a reference clock signal based on the reference bit rate frequency generated by the bit rate reference oscillator 14, and the reception clock generator 23 generates a reception clock signal based on the reference clock signal supplied from the reference clock generator 22. The data sampling unit 24 then samples the received data demodulated by the reception unit 12 based on the reception clock signal, and the decoder 25 decodes the sampled data.

Figure 4:
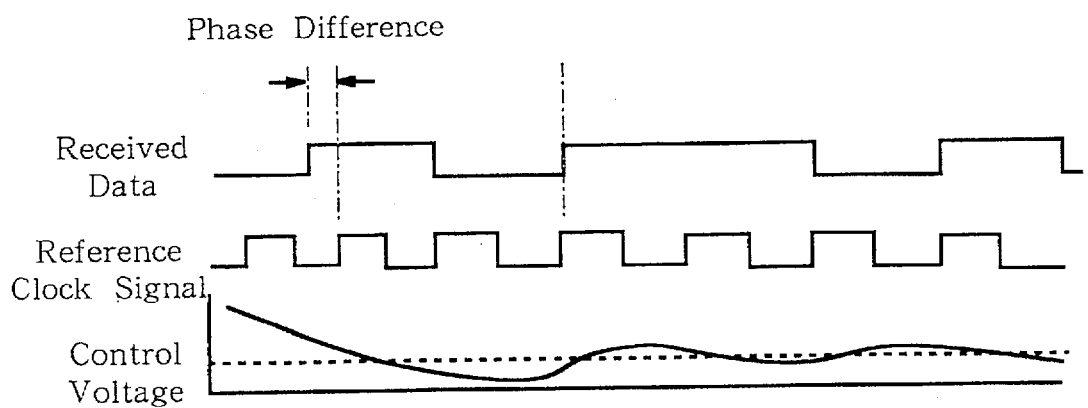
FIG. 4 is a diagram showing the relationship between the phase difference and the control voltage in the receiver shown in FIG. 2.

If there is a phase difference between the received data and the reference clock signal (reception clock signal), as shown in FIG. 4, then the receiver fails to receive the data with good reception sensitivity.

The timing of a change in the received data, which causes such a phase difference, is detected by the data change detector 21, and compared with the reference clock signal from the reference clock generator 22 by the reception clock generator 23, thus detecting the phase difference. The detected phase difference is supplied to the phase difference-to-voltage converter 26, which generates a control voltage in order to eliminate the phase difference, as shown in FIG. 4, and applies the control voltage to the variable capacitor 15.

As a consequence, the reference bit rate frequency generated by the bit rate reference oscillator 14 is varied, and the reference clock generator 22 changes its reference clock signal into phase with the timing of the change in the received data, whereupon the receiver can receive the data with a high level of reception sensitivity. In the example shown in FIG. 3, the control voltage is lowered to change the reference bit rate frequency in a manner to increase the period of the reference clock signal for thereby bringing the reference clock signal into phase with the timing of the change in the received data.

Therefore, the receiver automatically adjusts the reference bit rate frequency depending on the received data in an actual field of use, for decoding the received data with a high level of reception sensitivity at all times.

The phase difference-to-voltage converter 26 averages the phase differences for N bits (N is an integer) to produce a control voltage. More specifically, the phase difference-to-voltage converter 26 generates a control voltage based on phase differences averaged at a certain interval of time, for an increased accuracy for adjustment of the reference bit rate. If it is difficult to detect phase differences from the received data in an actual field of use due to noise caused by fading or interference, then the N is set to a larger value for frequency adjustment based on phase differences that are probabilistically highly reliable. On the other hand, if the received data used for frequency adjustment is obtained with a sufficiently high electric field intensity, then the N is set to a smaller value to shorten the time required to adjust the reference bit rate frequency.

The value of N in the phase difference-to-voltage converter 26 may be determined as desired depending on favorable conditions in view of the accuracy of frequency adjustment and the time required for frequency adjustment. It is preferable to set the N to a small value for frequency adjustment on the production line, and thereafter set the N to a greater value for use of the receiver in an actual field.

Figure 5:
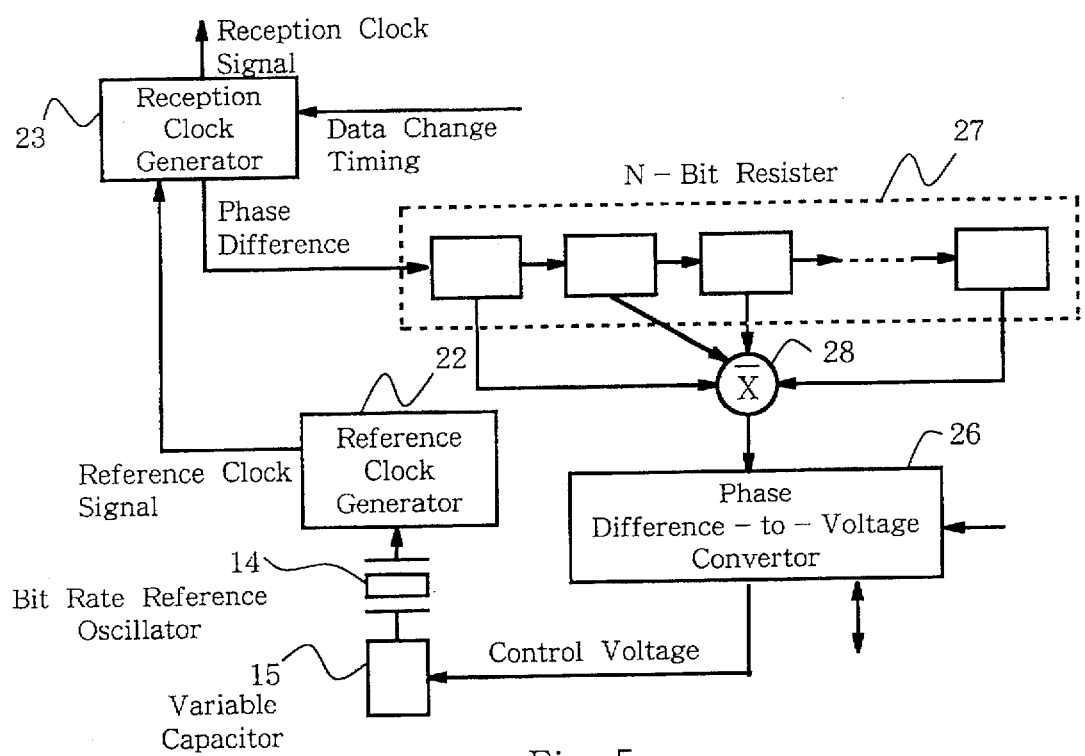
FIG. 5 is a block diagram of an arrangement for averaging phase differences to produce the control voltage in the decoding unit according to an embodiment of the present invention.

FIG. 5 shows an arrangement for averaging the phase differences for N bits to produce the control voltage in the decoding unit 13. As shown in FIG. 5, an N-bit register 27 and an adder/divider 28 are connected between the reception clock generator 23 and the phase difference-to-voltage converter 26. The N-bit register 27 successively stores the phase differences (phase difference information) outputted from the reception clock generator 23 for respective bit. When the N-bit register 27 has stored the phase differences for N bits, it outputs the stored phase differences to the adder/divider 28. The adder/divider 28 adds the phase differences for N bits, and divides the sum by N into an average phase difference, and then outputs the average phase difference to the phase difference-to-voltage converter 26.

The N-bit register 27 may be adjusted to vary the number of bits to be stored, i.e., the N, so that the N can be set to different values for frequency adjustment on the production line and use in an actual field.

In the receiver according to the above embodiment, the decoder 25 has a function of determining a reduction in the quality of the received data, and, if the quality of the received data is equal to or smaller than a preset value, controlling the phase difference-to-voltage converter 26 to generate a control voltage depending on the setting stored in the non-volatile memory 16. Therefore, even when the quality of the received data is poor in an actual field of use, the receiver is capable of adjusting the reference bit rate frequency at a certain level of accuracy.

The control voltage that has been obtained in a past event of frequency adjustment may be stored in the non-volatile memory 16, and applied as the setting from the phase difference-to-voltage converter 26 to the variable capacitor 15. In this case, however, the decoder 25 should have a function of writing the control voltage obtained in a past occurrence of frequency adjustment into the non-volatile memory 16.

Alternatively, it may be possible to have the receiver receive adjustment data such as of a PN (pseudo-noise) random pattern on the production line, cause the non-volatile memory 16 to store a control voltage which is generated by the phase difference-to-voltage converter 26 upon reception of the adjustment data, and use the stored control voltage as the setting. In this modification, the operator should control the decoder 25 on the production line to write the control voltage produced on the basis of the adjustment data into the non-volatile memory 16.

Although certain preferred embodiments of the present invention have been shown and described in detail, it should be understood that various changes and modifications may be made therein without departing from the scope of the appended claims.

What is claimed is:

1. A receiver comprising:
   a reception unit for demodulating received data;
   a decoding unit for decoding the received data which has been demodulated by said reception unit; and
   a reference oscillator for supplying a reference bit rate frequency to said decoding unit;
   wherein, said reference oscillator comprising a voltage-controlled oscillator for varying the reference bit rate frequency according to a control voltage applied thereto; and
   said decoding unit comprising:
   a data change detector for detecting the timing of a change in the received data;
   a reference clock generator for generating a reference clock signal based on said reference bit rate frequency;
   a reception clock generator for generating a reception clock signal based on said reference clock signal and detecting the phase difference between said reference clock signal and said timing of the change in the received data;
   a data sampling unit for sampling the received data based on said reception clock signal;
   a decoder for decoding the received data which has been sampled by said data sampling unit; and
   a phase difference-to-voltage converter for converting the phase difference between said reference clock signal and said timing of the change in the received data into a control voltage and applying said control voltage to said reference oscillator.

2. A receiver according to claim 1, wherein said phase difference-to-voltage converter comprises means for averaging phase differences over a freely selectable period of time and converting the obtained average phase difference into said control voltage.

3. A receiver according to claim 1, wherein said decoder comprises means for supplying a setting to said phase difference-to-voltage converter if a received data has a quality lower than a preset value, whereby said phase difference-to-voltage converter can apply a control voltage based on the setting supplied thereto to said reference oscillator.

4. A receiver according to claim 2, wherein said decoder comprises means for supplying a setting to said phase difference-to-voltage converter if a received data has a quality lower than a preset value, whereby said phase difference-to-voltage converter can apply a control voltage based on the setting supplied thereto to said reference oscillator.

5. A receiver according to claim 3, further comprises a memory for storing a setting which has been obtained by reception of adjustment data when the receiver is manufactured, and said decoder comprises means for reading and supplying the setting in the memory to said phase difference-to-voltage convertor, thereby said phase difference-to-voltage converter can supply a control voltage based on the setting supplied thereto to said reference oscillator.

6. A receiver according to claim 4, further comprises a memory for storing a setting which has been obtained by reception of adjustment data when the receiver is manufactured, and said decoder comprises means for reading and supplying the setting in the memory to said phase difference-to-voltage convertor, thereby said phase difference-to-voltage converter can supply a control voltage based on the setting supplied thereto to said reference oscillator.

7. A receiver according to claim 5, wherein said received data is previously added an error bit detecting/correcting code and said decoder determines the quality of the received data based on an error rate detected by using the error bit detecting/correcting code.

8. A receiver according to claim 6, wherein said received data is previously added an error bit detecting/correcting code and said decoder determines the quality of the received data based on an error rate detected by using the error bit detecting/correcting code.

9. A receiver according to claim 1, wherein said phase difference-to-voltage converter comprises means for averaging phase differences regarding the received data of N bits (N is an integer) and converting the obtained average phase difference into said control voltage.

10. A receiver according to claim 9, wherein the value of N is prescribed smaller when a setting which is used for the control vlotage generation is determined by using an adjustment data on the production line than the value of N which is set for the control voltage generation when using the receiver in an actual field.

* * * * *